United States Patent [19]

Wristers et al.

[11] Patent Number: 5,591,681
[45] Date of Patent: Jan. 7, 1997

[54] METHOD FOR ACHIEVING A HIGHLY RELIABLE OXIDE FILM

[75] Inventors: Dirk J. Wristers; Dim-Lee Kwong; H. Jim Fulford, Jr., all of Austin, Tex.

[73] Assignee: Advanced Micro Devices, Inc., Sunnyvale, Calif.

[21] Appl. No.: 253,771

[22] Filed: Jun. 3, 1994

[51] Int. Cl.$^6$ .............................................. H01L 21/3115
[52] U.S. Cl. .......................... 437/240; 437/983; 437/242; 437/43; 257/325
[58] Field of Search ............................ 437/43, 240, 983, 437/242; 257/325, 410; 148/DIG. 118

[56] References Cited

U.S. PATENT DOCUMENTS

| | | | |
|---|---|---|---|
| 4,567,061 | 1/1986 | Hayashe et al. | 437/240 |
| 4,784,975 | 11/1988 | Hofmann et al. | |
| 5,296,411 | 3/1994 | Gardner et al. | |
| 5,306,658 | 4/1994 | Gill | 437/43 |
| 5,382,550 | 1/1995 | Iyer | |

FOREIGN PATENT DOCUMENTS

| | | |
|---|---|---|
| 0585972 | 3/1994 | European Pat. Off. |
| 62-158866 | 7/1987 | Japan. |
| 5-299412 | 11/1990 | Japan. |

OTHER PUBLICATIONS

Wu et al., "Nitridation–induced surface donor layer in silicon", Applied Physics Letters, vol. 55, No. 16, pp. 166, 1989.

Primary Examiner—George Fourson
Attorney, Agent, or Firm—Foley & Lardner

[57] ABSTRACT

High quality oxides utilized in tunnel oxides and CMOS gate oxides are formed using a process that includes annealing a semiconductor substrate, after the oxide has been formed, in an ambient comprised of NO to form a surface layer in the oxide containing a concentration of nitrogen. A high-quality tunnel oxide, suitable for EEPROM devices, is formed upon a surface region of a semiconductor body over a heavily-doped N+ layer by first oxidizing the semiconductor body to form an oxide upon the surface region of the semiconductor body over the heavily-doped N+ layer. Next, the semiconductor body is annealed, under a gettering ambient, to densify the oxide and to dope the oxide at its surface and for a portion thereinto near its surface with a gettering agent. The semiconductor body is then oxidized, under an oxidizing ambient, to thicken the oxide. The annealing step in NO improves characteristics for both the gate and tunnel oxides of the device at a temperature substantially reduced from prior art methods and in an ambient atmosphere containing significantly more NO. The NO anneal can be performed in a variety of ways including an RTP anneal, a furnace anneal and can be performed on processes where the oxides are formed using CVD and PECVD.

32 Claims, 5 Drawing Sheets

METHOD FOR ACHIEVING A HIGHLY RELIABLE OXIDE FILM

BACKGROUND OF THE INVENTION

1. Field of the Invention

This invention relates to the fabrication of semiconductor devices, and more specifically, to methods for fabricating high quality oxides for semiconductor devices.

2. Description of the Related Art

High quality oxides are important in the fabrication of semiconductor devices. This is particularly true in such devices as electrically erasable programmable read only memories (EEPROMs) and gate oxides of MOS transistors where the oxides function as dielectrics and are key to electrical performance of the device. The thin tunnel oxides of EEPROM devices typically have thicknesses well under 100 Å. High quality dielectrics are needed in such devices to achieve satisfactory device performance both in terms of speed and longevity.

It has been found that the presence of nitrogen in the oxide significantly improves the tunnel oxides of EEPROM devices as well as gate oxides of MOS transistors. The presence of nitrogen in the oxide layer, typically a silicon dioxide film, significantly improves the breakdown characteristics of the film. The role of the nitrogen in improving the oxides has been postulated to relax the Si—O bonds by forming Si—N bonds or N—O bonds. See H. Fukada et al. IEEE Elect. Dev. Letters, vol 12, no. 11, 1991 and A. T. Wu et al., Appl. Physics. Lett., vol. 55, 1989. The formation of Si—N or N—O bonds enhances the bond strength and reduces the interface trap density.

MOS capacitors with $N_2O$ nitrided oxides show extremely tight Time Dependent Dielectric Breakdown (TDDB) distributions. The improvement in TDDB persists even after complete processing and is observed for various structures such as capacitors on p-substrate, capacitors on n+ implanted regions, and surface capacitors.

It has recently been discovered that the use of the source gas $N_2O$ as a source of nitrogen following thin gate oxide growth is an effective source of nitrogen under specific temperature conditions and thus can significantly enhance the dielectric qualities of the oxide film. The mechanism is believed to work by the nitrogen incorporating itself at the $Si/SiO_2$ interface, replacing the hydrogen that has attached itself to the dangling bonds at that interface. The bonding strength of nitrogen is much higher than that of hydrogen making for a much more stable film under thermal, electric field or radiation stress.

In tunnel oxides, breakdown occurs because of the trapping of charge in the oxide, thereby gradually raising the electric field across the oxide until the oxide can no longer withstand the induced voltage. Higher quality oxides trap less charge over time and will therefore take longer to break down.

It is believed that the improvement in time to breakdown for both tunnel oxides and gate oxides is due to the charge stability in the $Si/SiO_2$ interface, the poly-silicon/$SiO_2$ and throughout the gate oxide and tunnel oxide region afforded by the presence of nitrogen and the tunnel in gate oxides.

The use of the source gas $N_2O$ following thin gate oxide growth is described in U.S. Pat. No. 5,296,411 which is assigned to the same assignee, and which is incorporated herein by reference.

In the U.S. Pat. No. 5,296,411, a rapid thermal anneal is performed in an $N_2O$ ambient environment following formation of a thin oxide layer. In order for the $N_2O$ anneal to be effective, when utilized in, e.g., a diffusion tube or an RTA system, a temperature of approximately 1,050° C. has been utilized previously. It has been observed that just adding nitrogen as a source gas will not provide the same results. Thus, it was key to use $N_2O$ as a source gas and to decompose $N_2O$ with a sufficiently high temperature in order for the improvement due to the presence of nitrogen in the $Si/SiO_2$ interface to be observed. It is noted that an $O_2+N_2$ mixture will not produce the required improvement of the gate oxide (or tunnel oxide). Further, having $O_2$ present during the anneal step provides additional unwanted oxidation. An anneal step in an $N_2O$ ambient as described in the U.S. Pat. No. 5,296,411, forms approximately another 15 Å to the oxide layer.

The use of the high temperatures needed for $N_2O$ breakdown can cause increased stress on the semiconductor wafer as well as increasing the dopant diffusion. Additionally, even when $N_2O$ is broken down using relatively high temperatures, the amount of NO present is only approximately 5%.

Thus, despite the quality improvement shown in oxides due to the use of an $N_2O$ anneal, improvements which further enhance oxide quality and a process that provides this improvement at low temperatures is desirable.

SUMMARY OF THE INVENTION

It therefore is an object of the invention to provide a method for more effectively providing a semiconductor device containing an oxide layer having at least a surface layer with a concentration of nitrogen.

It is a further object of this invention to further improve the break down characteristics of tunnel oxides utilized, for example, in EEPROM devices and gate oxides for MOS transistors by introducing nitrogen into the oxide at a temperature lower than that required for breaking down $N_2O$.

It is still another object of this invention to provide an NO ambient environment that is richer in NO than that afforded by the thermal decomposition of $N_2O$.

It is still another object of this invention to provide an anneal step that provides a significantly enhanced control over oxide growth during this step.

These and other objects of the invention are achieved by using NO as a source gas to obtain a superior dielectric film relative to an $SiO_2$ as well as an $N_2O$ oxide film. A method is provided for exposing an oxide layer to an ambient atmosphere consisting essentially of NO, thereby forming a region in the oxide layer having a concentration of nitrogen.

Further, a method is provided for forming an oxide layer above a surface of a semiconductor substrate and annealing the semiconductor substrate having the oxide layer in an ambient atmosphere comprised of more than 5% NO.

Further, a method is provided for forming an oxide layer on a surface of the semiconductor substrate and annealing the semiconductor substrate in an ambient containing nitrogen at a temperature less than 1000° C.

By using NO as a source gas, control over the film thickness is significantly enhanced because little $O_2$ is present providing unwanted oxidation during the nitration of the film interface. In fact, the growth during nitration of the film interface can be self limiting to, e.g., about two additional angstroms.

Additionally, much lower temperatures (e.g. 800° C.) can be used because there is no need for the thermal energy required to decompose $N_2O$ when the NO is applied in a Rapid Thermal Anneal (RTA) system or conventional diffusion tube. By simply flowing NO at the end of the oxidation process for a predetermined period of time at a predetermined temperature, superior dielectric film can be obtained. Additionally, the advantages of utilizing NO is also applicable where the $SiO_2$ is grown utilizing a chemical vapor deposition (CVD) process. Also, the same advantages of NO can be found where the film is grown using a Plasma Enhanced Chemical Vapor Deposition Process (PECVD).

These and other objects and advantages of the invention will be better understood in relation to the following detailed description and the accompanying drawings.

DETAILED DESCRIPTION OF THE PREFERRED EMBODIMENTS

The process of forming an oxide film according to the invention can be used wherever oxide films are utilized such as in the formation of EEPROM devices or gate oxides of MOS devices.

FIGS. 1–7 are cross-sectional views illustrating a sequence of process steps for forming gate and tunnel oxides in a P-well active area of a CMOS EEPROM process. The gate oxide is used to fabricate N-channel MOS transistors, and the tunnel oxide is used to fabricate a structure useful to an EEPROM cell element.

Figure 1:
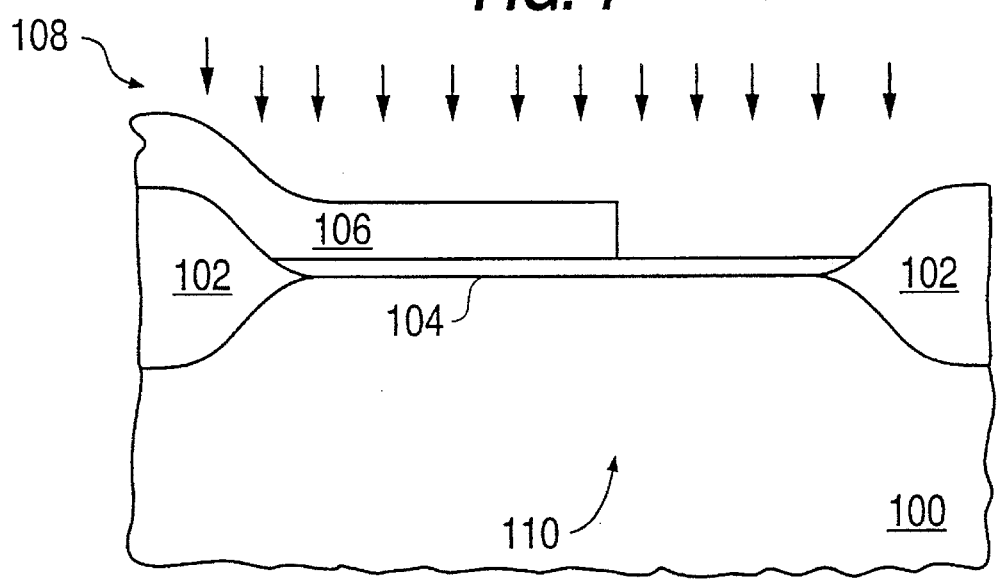
FIGS. 1–7 are cross sectional views illustrating the process steps utilized in forming gate and tunnel oxides in a P-well active region in a CMOS EEPROM process.
Figure 2:
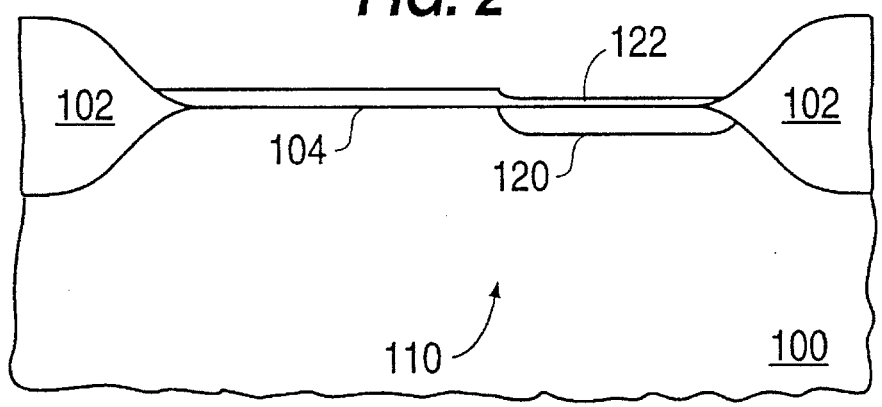

Referring to FIG. 1, P-well field oxides 102 are formed using a LOCOS process upon substrate 100. P-well field oxides 102 define a P-well active area 110 between the field oxides 102. KOOI oxide 104 then is grown in a steam oxidation environment to a thickness of approximately 300 Å. The growing and subsequent removing of KOOI oxide is a well known procedure for eliminating the remnant KOOI ribbon of nitride which forms around the active area at the LOCOS edge during the previous field oxidation. (Silicon nitride in a steam oxidation environment decomposes into ammonia and silicon dioxide. The ammonia diffuses down through the field oxide until reaching the silicon surface, where it reacts to form a silicon nitride,and leaving a ribbon of nitride at the silicon/silicon dioxide interface around the edge of the active area.) Photoresist then is applied and defined to form photoresist layer 106 which exposes a portion of the KOOI oxide 104 over the P-well active area 110.

Next, a phosphorus implant 108 is implanted through the exposed KOOI oxide and into the substrate 100 in the P-well active area 110 for the EEPROM process of this embodiment. Other regions of the substrate are masked by the photoresist layer 106. Photoresist layer 106 is then removed and the surface is prepared for annealing by an RCA clean operation, resulting in the structure shown in FIG. 2. Phosphorus implant layer 120 has been created by the heavy dose of the phosphorus implant 108. Due to the implant damage to the KOOI oxide which was exposed to the phosphorus implant 108, the RCA clean operation etches some of the implant-damaged KOOI oxide, resulting in etched KOOI oxide 122 approximately 100 Å thick in the region above phosphorus implant layer 120. KOOI oxide 104 which was formerly protected by photoresist layer 106 and consequently not damaged by phosphorus implant 108 remains substantially unetched at 300 Å thick.

An anneal operation follows which both drives the phosphorus implant layer 120 into the substrate 100, thereby lowering the surface concentration of phosphorus, and activates the phosphorus implant, thereby forming an N+ layer in the P-well.

Figure 3:
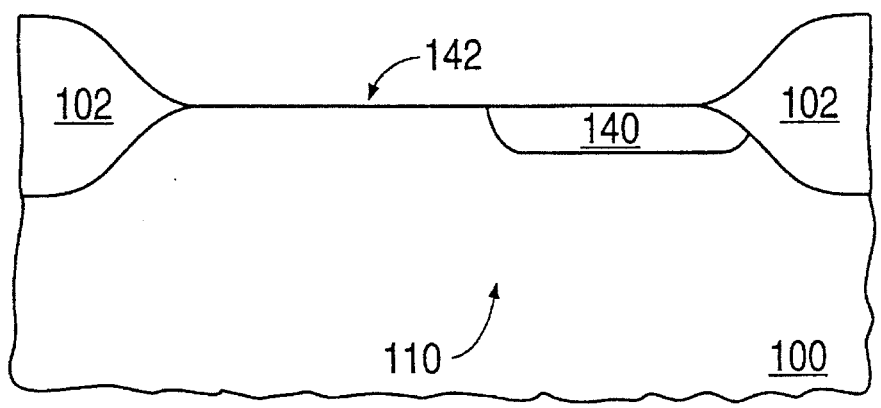
Figure 4:
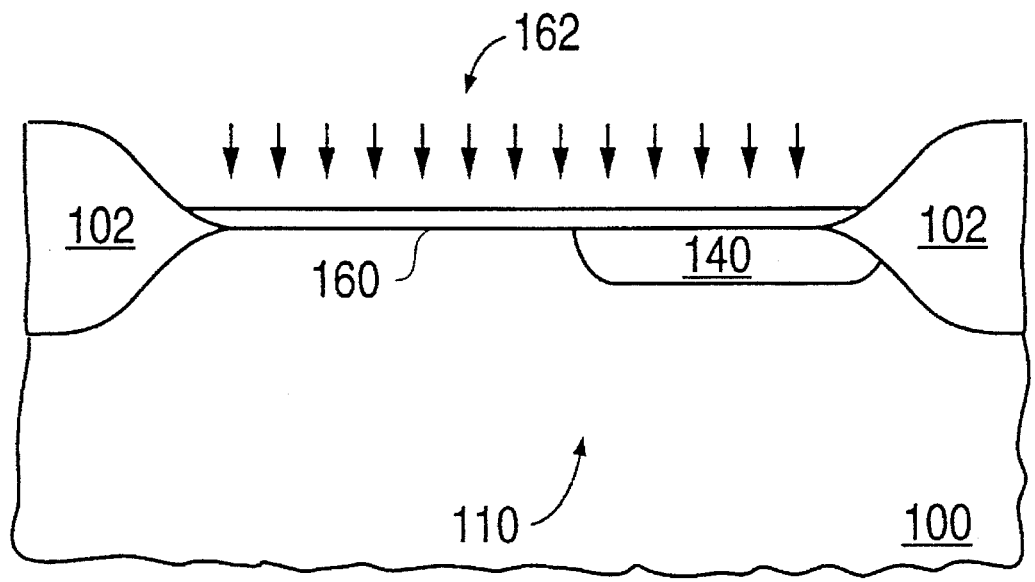

Next, a short oxide etch (e.g., 1.7 minutes in 10:1 HF) removes the remaining KOOI oxide 104 and etched KOOI oxide 122 from the surface of the P-well in preparation for gate oxidation. Preferable etch conditions for this pre-gate oxidation etch step are discussed in copending, commonly assigned U.S. patent application Ser. No. 07/969,708, filed on Oct. 29, 1992, which names Mark I. Gardner, Henry Jim Fulford, Jr., and Jay J. Seaton as inventors and is entitled "Method for Achieving a High Quality Thin Oxide in Integrated Circuit Devices", which application is incorporated herein by reference in its entirety. The resulting structure is shown in FIG. 3, and shows P-well active area surface 142 free of overlying oxide, and further shows the formation of N+ layer 140, being deeper and broader than the previous unactivated phosphorus implant layer 120 due to the drive in accomplished during the previous anneal step.

Next, a gate oxide is formed over the P-well active area 110. This is grown in a dry oxidation environment and results in the structure of FIG. 4. Gate oxide 160 is approximately 225 Å thick. An in-situ anneal is preferably performed at the conclusion of the gate oxidation cycle by changing the ambient gases in the oxidation furnace to an inert annealing ambient, while continuing to apply a high temperature (e.g., 1000 degree(s) C. for 30 minutes in Argon). Preferable gate oxidation conditions are discussed in commonly assigned U.S. patent application Ser. No. 07/959,230, filed on Oct. 9, 1992, which names Mark I. Gardner and Henry Jim Fulford, Jr. as inventors and is entitled "Method for Achieving a High Quality Thin Oxide Using a Sacrificial Oxide Anneal", now U.S. Pat. No. 5,316,981, which is incorporated herein-by reference in its entirety.

$V_{TT}$ Implant 162 is then implanted over the whole wafer to set the nominal threshold of MOS transistors to be fabricated later in the P-wells. This is preferably a light boron implant which is applied without any masking photoresist (i.e. a "blanket implant") to both P-well regions and N-well regions (not shown). A separate $V_{TP}$ implant (not shown) is then implanted into the N-well regions (not shown) to adjust the threshold of P-channel MOS transistors to be fabricated later in the N-wells. To accomplish this, a photoresist layer is applied and defined to cover the P-wells while exposing the N-wells, the implant into the N-wells is performed, and the photoresist overlying the P-wells then removed.

Figure 5:
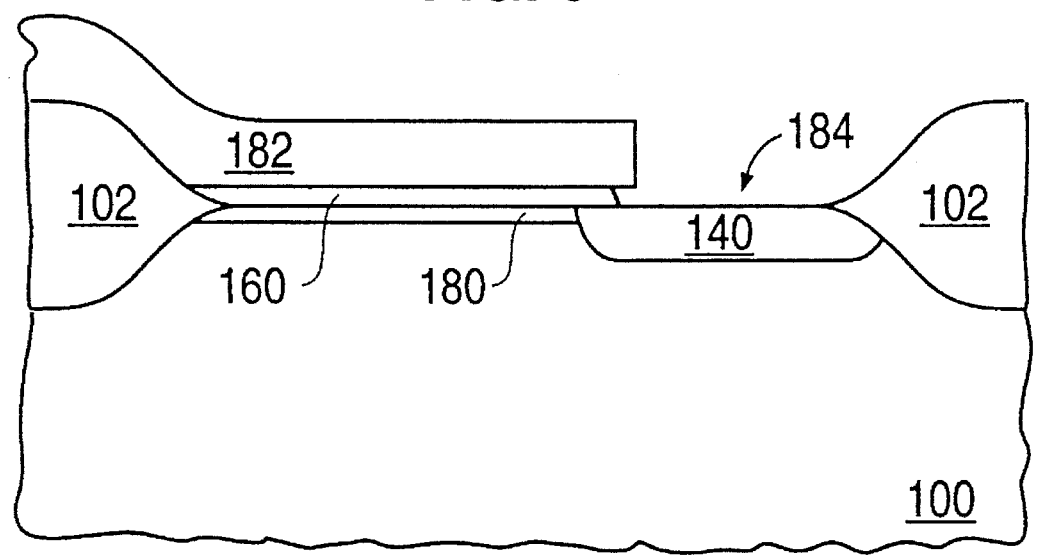
Figure 6:
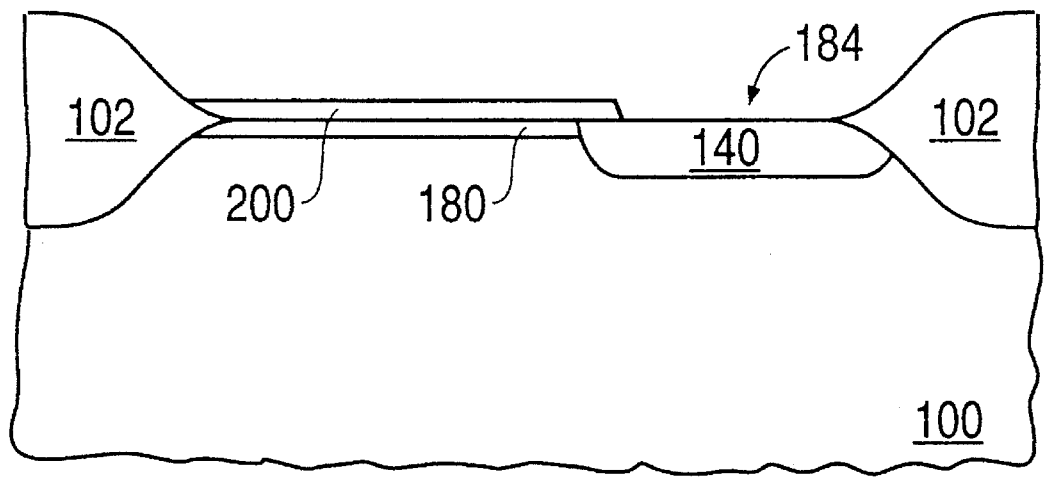

Continuing with the process sequence as affects the P-well shown, a photoresist layer is applied and defined to expose the gate oxide 160 over the N+ layer 140, followed by an etch step to remove the exposed gate oxide. This Tunnel Opening etch may be a 0.2 minute etch in a 6:1 buffered oxide etchant, and removes the 225 Å of gate oxide to expose the surface of the substrate over the N+ layer 140. Preferable conditions for this etch are discussed in the above-referenced patent application entitled "Method for Achieving a High Quality Thin Oxide in Integrated Circuit Devices" (Ser. No. 07/969,708). The resulting structure is shown in FIG. 5 and shows the N+ surface 184 exposed by the tunnel opening etch. Photoresist layer 182 defines the tunnel opening and protects the remainder of gate oxide 160 not overlying N+ layer 140. The as-yet unactivated $V_{TI}$ implant layer 180 is shown under the gate oxide 160. $V_{TI}$ implant layer 180 is not shown extending into N+ layer 140 because the doping density of N+ layer 140 is far greater than that of $V_{TI}$ implant layer 180.

Next, the photoresist layer 182 is removed and an additional etch operation is performed for 50 seconds in 50:1 HF to reduce the thickness of gate oxide 160 from 225 Å down to approximately 140 Å. Preferable etch conditions are discussed in the above-referenced patent application entitled "Method for Achieving a High Quality Thin Oxide in Integrated Circuit Devices" (Ser. No. 07/969,708), and results in the structure shown in FIG. 6. Etched gate oxide 200 is approximately 140 Å thick. This etch also serves to remove any native oxide formed over N+ surface 184 subsequent to the etching of gate oxide 160.

Figure 7:
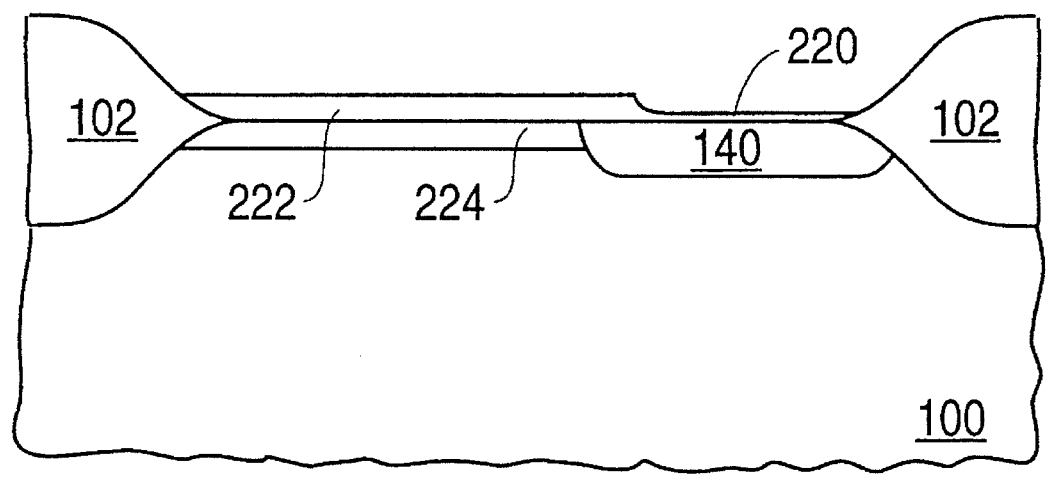

Lastly, an oxidation sequence as described in Table 1, grows a tunnel oxide from N+ surface 184 over N+ layer 140 and also increases the thickness of the existing etched gate oxide 200. As is shown, the tunnel oxidation proceeds as a three-stage oxidation cycle, with HCl gettering performed between the first and second stages, and again between the second and third stages. This procedure keeps the HCl away from both the silicon and the polysilicon interfaces, while still providing a high enough HCl concentration within the body of the gate oxide to getter any mobile ionic charge or heavy metals that may be present. HCl coming into contact with either a silicon or polysilicon interface will degrade that interface surface, and likewise degrade any oxide contiguous to that surface. Additionally, the gettering steps provide an annealing environment for the partially-grown oxide which serves to reduce roughness at the $Si/SiO_2$ interface and to densify the oxide, both of which are useful in promoting a high quality oxide. After the third stage of oxidation, there follows a ramp-down in temperature. Referring to FIG. 7, tunnel oxide 220 is nominally 87 Å thick, while reoxidized gate oxide 222 is now nominally 180 Å thick. The unactivated $V_{TI}$ implant layer 180 has been activated by the tunnel oxidation sequence, resulting in $V_{TI}$ layer 224.

Subsequent to this step a polysilicon layer is deposited, doped, and defined to form, in accordance with any of a variety of well-known processes, transistors, interconnect, and other features. In particular, the polysilicon is deposited above tunnel oxide 220 to form a structure useful to an EEPROM cell which conducts current through tunnel oxide 220 if the electric field across the tunnel oxide 220 is high enough. Measurements of oxide quality can be made immediately after the polysilicon layer is patterned into useful structures.

The present inventors have found that annealing the tunnel oxide in an ambient environment comprised of NO and which therefore results in a surface layer of the tunnel oxide containing a percentage of nitrogen, greatly improves the integrity of the tunnel oxide. The present inventors have also found that the addition of such an anneal step in the tunnel oxidation sequence improves the quality of a gate oxide which is further oxidized and thickened by the tunnel oxidation sequence.

The atmosphere can comprise any desired amount of NO so as to achieve the desired nitrogen introduction into the oxide layer. It is preferable that the ambient environment of the anneal step be comprised of a substantial percentage of NO. While this percentage can range from greater than 5% to about 100% NO, for particular applications a different range, such as about 10% to about 100% may be preferable. Additionally, a range of about 50% to about 100% may be preferable in order to have a higher percentage of NO available to provide nitrogen for the oxide. For specific applications, about 100% NO may be preferable to maximize the amount of NO available as a nitrogen source for the oxide.

In order for the anneal step to improve the characteristics of the oxide when $N_2O$ is utilized as a source gas, the $N_2O$ needs to be heated to a sufficient temperature to break down the $N_2O$ into $N_2+NO+O_2$. It has been observed that the addition of the thermal energy to the $N_2O$ decomposes the $N_2O$ into 5% NO+60% $N_2$+35% $O_2$. However, according to the invention, one can utilize lower temperatures since the high temperatures to disassociate $N_2O$ are not required when NO is utilized. Additionally, more NO can be made available, since the decomposition of $N_2O$ results in only about 5% NO.

One example of a tunnel oxidation sequence including an NO anneal, according to the present invention, is described in Table 1. The tunnel oxidation proceeds as a three-stage oxidation cycle, with HCl gettering (step 4) performed between the first and second stages (steps 3 and 5), and again between the second and third stages (steps 5 and 7). After the third stage of oxidation (step 7) and a ramp-down in temperature, a rapid thermal anneal (RTA, step 10) is performed in an NO ambient environment. The second and third oxidation times are adjusted such that approximately 60 Å of tunnel oxide is formed by the end of the third oxidation step (step 7 in Table 1). The first oxidation step (step 3 in Table 1) is set to 12 minutes to ensure an adequate thickness of oxide covers the substrate before the introduction of the HCl during the first gettering step (step 4), in order to prevent the HCl from contacting the silicon surface.

The thicknesses of the oxides can of course be adjusted to accomadate a wide variety of fabrication needs.

The NO anneal step forms approximately another 2 Å of oxide, resulting in a final thickness of approximately 62 Å.

Steps 1–9 of Table 1, which include the oxidation and gettering steps, are preferably performed in a diffusion tube, while step 10 is preferably performed in an RTA system. When performed in the RTA system, the NO is preferably flowed for a period ranging from about 10 seconds to about three minutes. Temperatures can range from about 800° to about 1050° C. as indicated in Table 1. The time and temperature should be sufficient to incorporate the nitrogen into the oxide. Generally, lower temperatures, where possible, are advantageous in semiconductor fabrication.

Since little $O_2$ is present when the NO is flowed, unwanted oxidation during the nitration of the film interface is minimized. The oxide film growth is self limiting to about two additional angstroms. This compares to the additional growth resulting from an $N_2O$ anneal step, which can result in approximately another 15 angstroms of oxide.

The final anneal (step 10) can also be performed in a diffusion tube or furnace if desired. Earlier doping profiles may need to be adjusted due to the high thermal mass of the tube and the resultant additional time at high temperature a wafer would experience compared to an RTA anneal. For a furnace anneal containing an NO ambient, the temperature range would preferably be from about 800° to about 1000° C. for about 15 minutes. The film growth when the furnace anneal is used for this step is also self limiting and results in an additional growth of about two angstroms.

TABLE 1

| STEP | GASSES | TEMP | TIME |
| --- | --- | --- | --- |
| 1. Push/Stabilize | Ar | Ramp to 800° C. Final Temp | t = 28 min. |
| 2. Ramp to 850 | Low $O_2$/Ar | 850° C. Final Temp | t = 10 min. |
| 3. Oxidation | $O_2$ | 850° C. | t = 12 min. |
| 4. HCl Getter | HCl/Ar | 850° C. | t = 5 min |
| 5. Oxidation | $O_2$ | 850° C. | t = 2.5 min |
| 6. HCl Getter | HCl/Ar | 850° C. | t = 5 min |
| 7. Oxidation | $O_2$ | 850° C. | t = 2.5 min |
| 8. Ramp to 800 | $N_2$ or Ar | 800° C. Final Temp | t = 16 min |
| 9. Pull/Stabilize | $N_2$ or Ar | Less than 500° C. | t = 31 min |
| 10. Anneal | NO | 800°–1050° | t = 10 sec to 3 min |

Figure 8A:
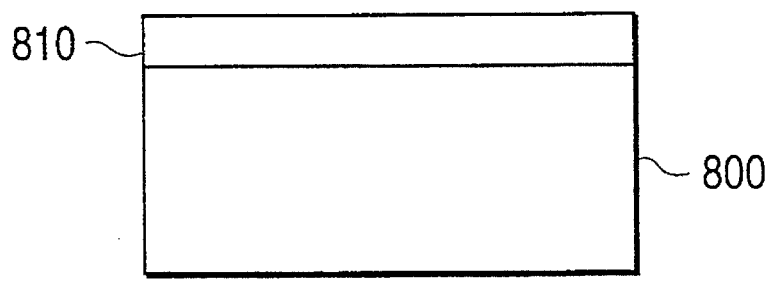
FIGS. 8a, 8b, 8c, 9a and 9b are cross sectional views illustrating an oxide formed using a CVD process having a surface layer containing nitrogen.
Figure 8B:
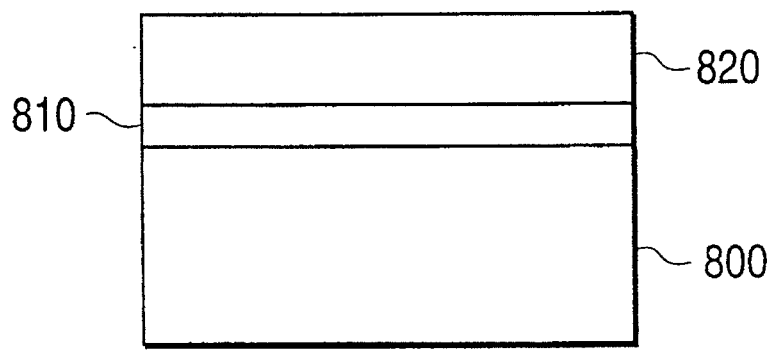
Figure 8C:
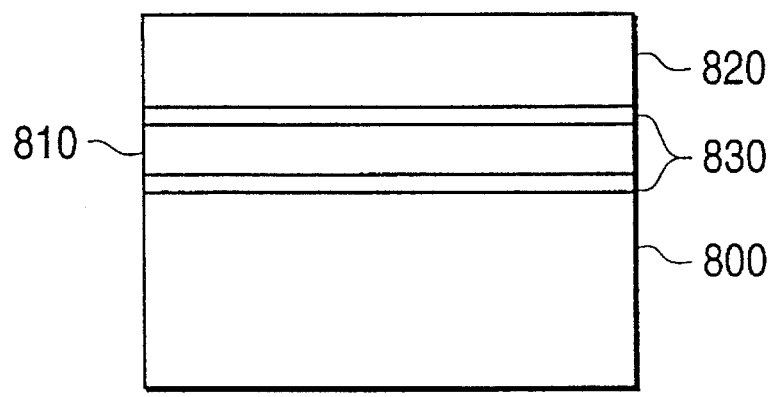
Figure 9A:
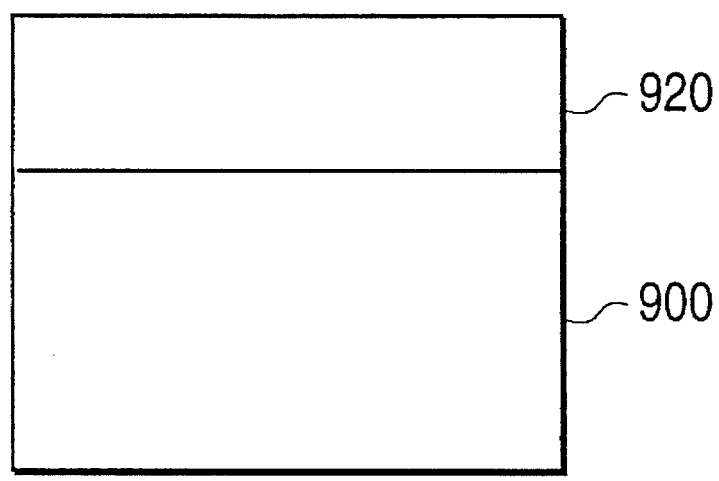
Figure 9B:
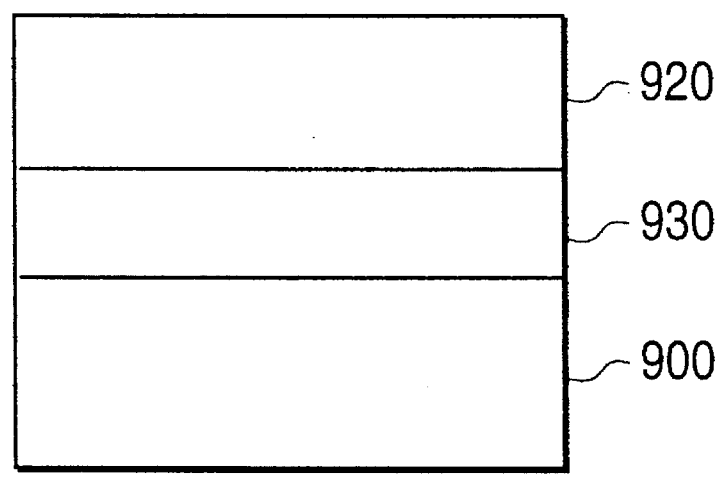

Another method, according to the invention, uses a chemical vapor deposition (CVD) process that is typically used to form gate oxides. Referring now to FIGS. 8a–8c, in one CVD process, the substrate 800 is first exposed to NO for a suitable period of time to prepare the surface of the substrate for the $SiO_2$ deposition. The NO is flowed at a temperature that can range from about 600° to about 1000° C. resulting in an oxynitride layer 810 of approximately 10 Å on substrate 800. Next an $SiO_2$ layer 820 is deposited using known CVD techniques resulting in the structure shown in FIG. 8b. This CVD step typically results in an oxide thickness of about 150 Å and below. Following this deposition, the oxide is exposed to NO at a temperature which can range from about 600° to about 1000° C. This results in several additional Angstroms of film thickness shown as layer 830.

In a second CVD process, the first NO step is omitted. Otherwise the same process is performed. An $SiO_2$ layer 920 with a thickness of 150 Å or less is deposited on substrate 900. Following this deposition, the oxide 920 is exposed to NO at a temperature sufficient to incorporate nitrogen, typically ranging from about 600° to about 1000° C. This results in up to an additional approximately 10 Å of film thickness shown as layer 930 which contains nitrogen.

Still another embodiment of the invention utilizes a plasma enhanced chemical vapor deposition (PECVD) process to provide for oxide growth and to expose the oxide to NO at relatively low temperatures of 300° C. and up. In this embodiment, conventional PECVD oxide growth is followed by a PECVD NO step to provide the advantages described hereinbefore.

The dielectric can also be an oxide/nitride/oxide. In this case, an oxide is grown, a nitride is deposited on the oxide and finally, the nitride is oxidized. An NO anneal is performed after each oxidation. Any of the processes described herein, e.g. CVD, PECVD, RTP or furnaces may be used to create the dielectric.

The nitrogen may also be introduced during some or all of the growth steps themselves, albeit requiring re-calibration of the optimal growth conditions necessary to yield an oxide of the desired thickness. The NO can be incorporated into the silane chemistry in order to obtain nitrated oxide all the way through. In such an embodiment, the process shown in Table 1 would by modified to incorporate NO into each of the oxide growth steps 3, 5 and 7 in Table 1.

Improving the dielectric means that one can pass larger amounts of charge through the oxide without changing its dielectric properties. This has applications in EEPROM/ memories, programmable logic devices (PLDs) and other devices. For example, the number of times a memory can be written and erased increases with the amount of charged passed. Thus, by increasing the amount of charge, one increases performance by increasing the number of programming cycles available for a memory.

The technique described herein, according to the invention, is particularly suited to improving the quality of deposited oxides and, as illustrated in the sequence of FIG. 1–7 in forming the gate oxide, for re-grown oxides. A deposited oxide is potentially useful for forming a tunnel oxide less than 50 Å thick, rather than growing the oxide as discussed above.

Alternatively, the sequence of Table 1, with the oxidation time of step 3 reduced to 2–3 minutes, can be used to form an oxide of approximately 50 Å.

It is believed that a concentration of nitrogen in the oxide provides a diffusion barrier to reduce the migration of dopant atoms, particularly boron, from an overlying polysilicon layer down through the oxide to the channel or substrate region below the oxide, which could degrade the performance of a device using the oxide (by significantly altering the doping profile of the substrate region). This diffusion barrier is particularly attractive when boron is present, because boron diffuses through oxide faster than either phosphorus or arsenic.

Furthermore, the nitrogen can be introduced earlier in the oxidation process than a final anneal. For example, nitrogen may be introduced during the gettering operations, and yield an oxide having similar quality improvements as the oxides discussed herein, even if the final anneal is only under an inert ambient.

While the above descriptions reference an EEPROM technology fabricated in a CMOS technology, the teachings of this disclosure can be advantageously applied to other semiconductor process technologies incorporating thin oxides. For example, a DRAM process requiring capacitors fabricated with very thin oxide dielectrics could benefit greatly from these teachings.

While the invention has been described with respect to the embodiments set forth above, the invention is not necessarily limited to these embodiments. For example, the invention is not necessarily limited to any particular transistor process technology. Moreover, many variations in certain of the process steps can be practiced. For example, the gate oxide etching step, which reduces the thickness of the previously grown gate oxide from 225 Å down to 140 Å, can be eliminated if the implant energies are adjusted to accommodate a thinner "implant oxide".

Accordingly, other embodiments, variations, and improvements not described herein are not necessarily excluded from the scope of the invention, which is defined by the following claims.

What is claimed is:

1. A method of forming an oxide film comprising the step of:

exposing an oxide layer to an ambient atmosphere consisting essentially of NO, thereby forming a region in the oxide layer having a concentration of nitrogen.

2. In a process of fabricating a semiconductor device, the method of forming an oxide comprising the steps of:

forming an oxide layer above a surface of a semiconductor substrate; and annealing the semiconductor substrate having the oxide layer in an ambient atmosphere comprised of more than 5% NO by volume.

3. The method as recited in claim 2, wherein the oxide is formed using a diffusion tube and the annealing step is performed in a rapid thermal anneal (RTA) system.

4. The method according to claim 3, wherein the annealing step is performed at temperatures ranging from 800° to about 1050° C.

5. The method according to claim 4, wherein the annealing step is performed for a time ranging from about 10 seconds to about three minutes.

6. The method as recited in claim 2, wherein the oxide is formed using a standard diffusion tube and the annealing step is performed in a standard diffusion tube.

7. The method according to claim 6, wherein the annealing step is performed at temperatures ranging from about 800° to about 1000° C.

8. The method according to claim 6, wherein the annealing step is performed for approximately 15 minutes.

9. The method as recited in claim 2, wherein the step of forming the oxide and the anneal step are performed using a plasma enhanced chemical vapor deposition (PECVD) process.

10. The method as recited in claim 2, wherein the oxide is formed on the semiconductor substrate using a chemical vapor deposition (CVD) system; and wherein the anneal step is performed in the CVD system to form a second oxide layer adjacent to the oxide layer, the second oxide layer containing nitrogen.

11. A method of fabricating a semiconductor device containing an oxide/nitride/oxide dielectric, comprising the steps of:

forming a first oxide layer above a surface of a semiconductor substrate;

annealing the semiconductor substrate having said first oxide layer in an ambient atmosphere consisting essentially of NO;

depositing a nitride layer on said first oxide layer;

forming a second oxide layer on said nitride layer;

annealing the semiconductor substrate having said first and second oxide layers in an ambient atmosphere consisting essentially of NO.

12. The method as recited in claim 2, wherein the ambient atmosphere is comprised of more than 10% NO by volume.

13. The method as recited in claim 2, wherein the ambient atmosphere is comprised of more than 50% NO by volume.

14. In an integrated circuit fabrication process, a method of forming an oxide upon a surface region of a semiconductor body, comprising the steps of:

oxidizing the semiconductor body a first time, under an oxidizing ambient, to form a first oxide layer upon the surface region;

annealing the semiconductor body a first time subsequent to the first oxidizing step, under a gettering ambient, to densify the first oxide layer and to dope the first oxide layer at its surface and for a portion thereinto adjacent the surface with a gettering agent;

oxidizing the semiconductor body a second time, under an oxidizing ambient, to form a second oxide layer upon the first oxide layer, subsequent to the first annealing step; and annealing the semiconductor body a second time, under an NO ambient, thereby forming a third oxide layer upon the second oxide layer, the third oxide layer containing a concentration of nitrogen;

wherein the first, second, and third oxide layers together form the oxide.

15. A method as in claim 14, wherein the second annealing step comprises a RTA annealing step.

16. A method as in claim 15, wherein the first annealing step is performed under an HCl/Ar ambient environment.

17. A method as in claim 15, wherein the first oxide layer annealing step is performed at a temperature of about 850 degree(s) C.

18. A method as in claim 15, wherein the first and second oxidizing steps are performed at a temperature of about 850 degree(s) C.

19. A method as in claim 15, further comprising the step of doping a portion of the semiconductor body under the surface region of the semiconductor body prior to the first oxidizing step.

20. A method as in claim 19, further comprising, subsequent to the second oxidizing step and prior to the second annealing step, the steps of:

annealing the semiconductor body a third time, under a gettering ambient, to densify the second oxide layer and to dope the second oxide layer at its surface and for a portion thereinto adjacent the surface with a gettering agent; and oxidizing the semiconductor body a third time, under an oxidizing ambient, subsequent to the third annealing step, to form a fourth oxide layer upon the second oxide layer;

wherein the first, second, third, and fourth oxide layers together form a high quality oxide.

21. In an integrated circuit fabrication process suitable for EEPROM devices, a method of forming a high-quality tunnel oxide upon a surface region of a semiconductor body over a heavily-doped N+ type layer therein, comprising the steps of:

forming a N+ type layer in the semiconductor body;

oxidizing the semiconductor body a first time, under an oxidizing ambient, subsequent to the N+ type layer forming step, to form an oxide upon a surface region of the semiconductor body over the heavily-doped N+ type layer;

annealing the semiconductor body a first time, under a gettering ambient, subsequent to the first oxidizing step, to densify the oxide and to dope the oxide at its surface and for a portion thereinto adjacent the surface with a gettering agent;

oxidizing the semiconductor body a second time, under an oxidizing ambient, subsequent to the first annealing step, to thicken the oxide; and annealing the semiconductor body for a second time, under an ambient consisting essentially of NO, subsequent to the second oxidizing step, thereby further thickening the oxide and forming a surface layer therein containing a concentration of nitrogen.

22. A method as in claim 21, wherein the second annealing step comprises a RTA annealing step.

23. A method as in claim 22, wherein the first annealing step is performed under an HCl/Ar ambient environment.

24. A method as in claim 23, wherein the first annealing step is performed at a temperature of about 850 degree(s) C.

25. A method as in claim 24, wherein the first and second oxidizing steps are performed at a temperature of about 850 degree(s) C.

26. A method as in claim 25, further comprising, subsequent to the second oxidizing step and prior to the second annealing step, the steps of:

annealing the semiconductor body a third time, under a gettering ambient, to further densify the oxide and to dope the oxide at its surface and for a portion thereinto adjacent the surface with a gettering agent; and oxidizing the semiconductor body a third time, under an oxidizing ambient, subsequent to the third annealing step, to further thicken the oxide.

27. In an integrated circuit fabrication process suitable for EEPROM devices, a method for forming a tunnel oxide upon a first surface region of a semiconductor body over a heavily-doped N+ type layer, and further for forming a gate oxide, of greater thickness than the tunnel oxide, upon a second surface region of the semiconductor body, comprising the steps of:

growing a first oxide upon the first surface region of the semiconductor body over the heavily-doped N+ type layer, and upon the second surface region of the semiconductor body;

removing a region of the first oxide, to expose a surface of the semiconductor body over the heavily-doped N+ type layer, and leaving a remaining region of the first oxide;

oxidizing the semiconductor body to form a tunnel oxide on the exposed surface of the semiconductor body while re-oxidizing the remaining region of the first oxide to form the gate oxide; and annealing the semiconductor body a first time, under an ambient atmosphere consisting essentially of NO, to further thicken the tunnel oxide and gate oxide and to form a surface layer each therein containing a concentration of nitrogen.

28. A method as in claim 27, wherein the oxidizing step comprises the steps of:

oxidizing the semiconductor body a first time, under an oxidizing ambient, to form an oxide upon the surface region;

annealing the semiconductor body a second time, under a gettering ambient, subsequent to the first oxidizing step, to densify the oxide and to dope the oxide at its surface and for a portion thereinto adjacent the surface with a gettering agent; and oxidizing the semiconductor body a second time, under an oxidizing ambient, subsequent to the second annealing step, to thicken the oxide.

29. A method as in claim 27, wherein the first annealing step comprises an RTA annealing step.

30. A method as in claim 29, wherein the second annealing step is performed under an HCl/Ar ambient environment.

31. A method as in claim 30, wherein the second annealing step is performed at a temperature of about 850 degree(s) C.

32. A method as in claim 31, wherein the first and second oxidizing steps are performed at a temperature of about 850 degree(s) C.

* * * * *